(12) United States Patent
Hasebe et al.

(10) Patent No.: US 9,123,782 B2
(45) Date of Patent: Sep. 1, 2015

(54) AMORPHOUS SILICON FILM FORMATION METHOD AND AMORPHOUS SILICON FILM FORMATION APPARATUS

(71) Applicant: TOKYO ELECTRON LIMITED, Tokyo (JP)

(72) Inventors: Kazuhide Hasebe, Nirasaki (JP); Hiroki Murakami, Nirasaki (JP); Akinobu Kakimoto, Nirasaki (JP)

(73) Assignee: TOKYO ELECTRON LIMITED (JP)

( * ) Notice: Subject to any disclaimer, the term of this patent is extended or adjusted under 35 U.S.C. 154(b) by 0 days.

(21) Appl. No.: 14/656,914

(22) Filed: Mar. 13, 2015

(65) Prior Publication Data

US 2015/0206795 A1    Jul. 23, 2015

Related U.S. Application Data

(62) Division of application No. 13/094,043, filed on Apr. 26, 2011, now Pat. No. 9,006,021.

(30) Foreign Application Priority Data

Apr. 27, 2010 (JP) ................................. 2010-102405
Mar. 1, 2011 (JP) ................................. 2011-044014

(51) Int. Cl.
*H01L 21/00* (2006.01)
*H01L 21/768* (2006.01)
*C23C 16/52* (2006.01)
*C23C 16/24* (2006.01)

(52) U.S. Cl.
CPC .......... *H01L 21/76843* (2013.01); *C23C 16/24* (2013.01); *C23C 16/52* (2013.01); *H01L 21/76876* (2013.01)

(58) Field of Classification Search
CPC ................................................ H01K 37/32082
See application file for complete search history.

(56) References Cited

U.S. PATENT DOCUMENTS

| 4,671,970 | A | * | 6/1987 | Keiser et al. ................... 438/427 |
| 5,856,236 | A | | 1/1999 | Lai et al. |
| 2005/0151209 | A1 | * | 7/2005 | Yamamoto et al. ........... 257/407 |

(Continued)

FOREIGN PATENT DOCUMENTS

| CN | 1630036 | 6/2005 |
| JP | 63029954 | 2/1988 |

(Continued)

*Primary Examiner* — Zandra Smith
*Assistant Examiner* — Andre' C Stevenson
(74) *Attorney, Agent, or Firm* — Cantor Colburn LLP

(57) ABSTRACT

An amorphous silicon film formation method includes transferring a base in a process chamber, heating the base in the process chamber, setting a process pressure inside the process chamber, forming a seed layer on a surface of the base by flowing aminosilane-based gas in the process chamber under a process condition in which the aminosilane-based gas is not thermally decomposed and adsorbing the aminosilane-based gas onto the surface of the base, the process condition having a first temperature, and forming an amorphous silicon film on the seed layer by heating the base at a second temperature higher than the first temperature, flowing silane-based gas containing no amino group in the process chamber, and thermally decomposing the silane-based gas containing no amino group, wherein the forming of the seed layer and the forming of the amorphous silicon film are successively performed in the process chamber.

18 Claims, 15 Drawing Sheets

(56) References Cited

U.S. PATENT DOCUMENTS

| | | |
|---|---|---|
| 2006/0154453 A1 | 7/2006 | Son et al. |
| 2006/0270217 A1 | 11/2006 | Balseanu et al. |
| 2009/0142874 A1 | 6/2009 | Arai |
| 2009/0263930 A1 | 10/2009 | Chae et al. |
| 2009/0291232 A1 | 11/2009 | Washio et al. |
| 2011/0263074 A1* | 10/2011 | Al-Bayati et al. ............. 438/96 |

FOREIGN PATENT DOCUMENTS

| | | |
|---|---|---|
| JP | 01217956 | 8/1989 |
| JP | 04027116 | 1/1992 |
| JP | 05136087 | 6/1993 |
| JP | 2009516906 | 4/2009 |
| KR | 1020020055925 | 7/2002 |
| KR | 100494321 | 5/2005 |
| KR | 1020090037821 | 4/2009 |

\* cited by examiner

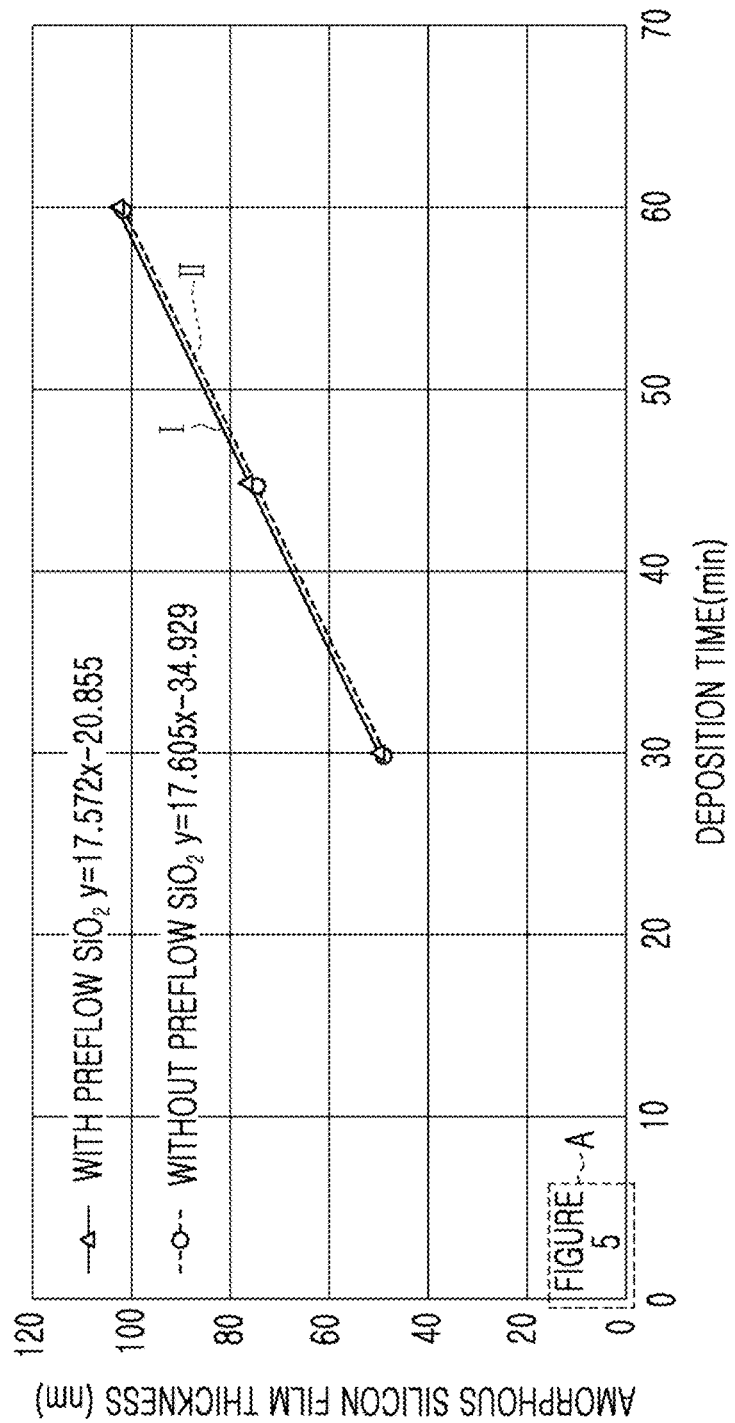

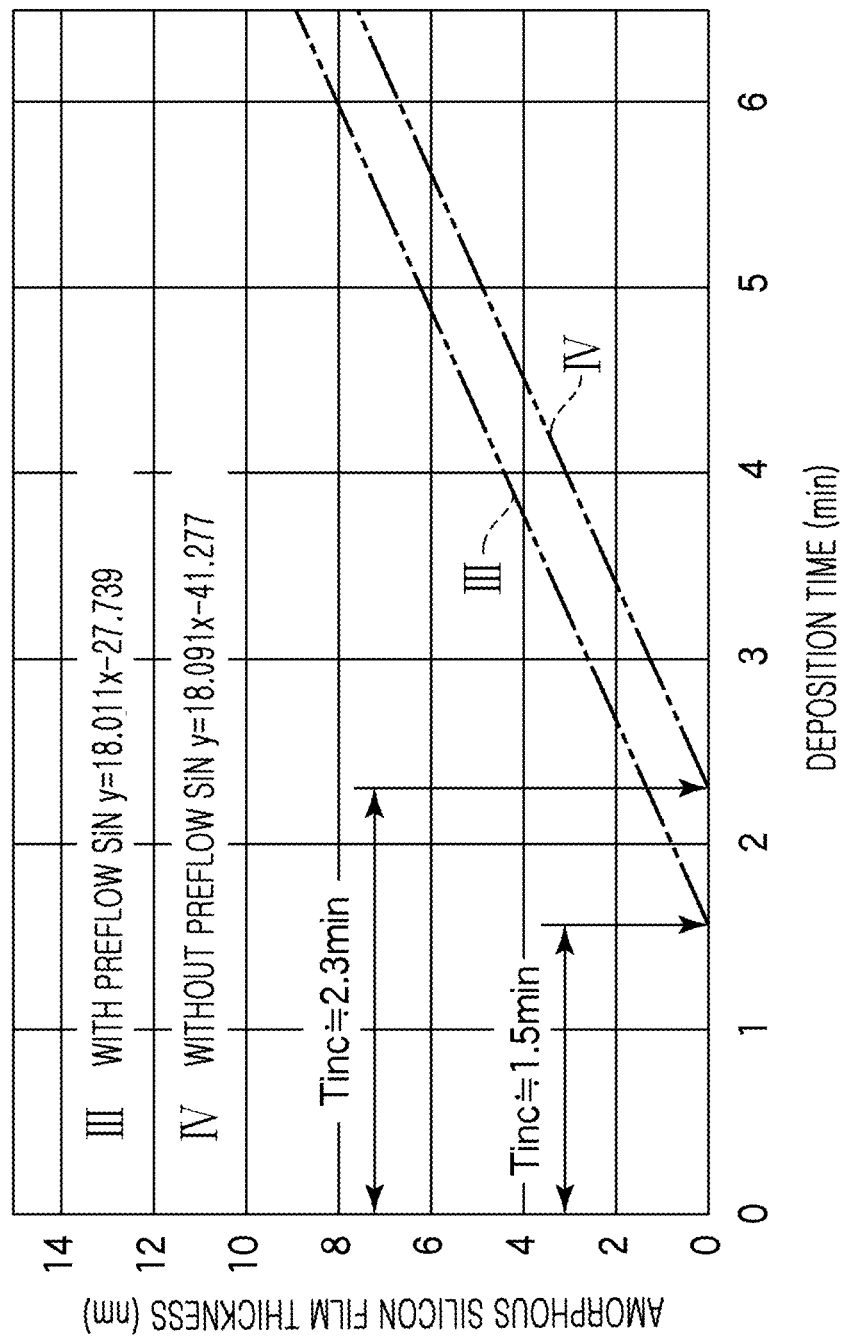

WITH PREFLOW
DEPOSITION TIME: 30min
FILM THICKNESS: ABOUT 50nm (COMPARATIVE EXAMPLE)
WITHOUT PREFLOW
DEPOSITION TIME: 30min
FILM THICKNESS: ABOUT 50nm WITH PREFLOW
DEPOSITION TIME: 60min
FILM THICKNESS: ABOUT 100nm (COMPARATIVE EXAMPLE)
WITHOUT PREFLOW
DEPOSITION TIME: 60min
FILM THICKNESS: ABOUT 100nm (COMPARATIVE EXAMPLE)

AMORPHOUS SILICON FILM FORMATION METHOD AND AMORPHOUS SILICON FILM FORMATION APPARATUS

CROSS-REFERENCE TO RELATED PATENT APPLICATIONS

This application is a divisional application of prior U.S. application Ser. No. 13/094,043, filed on Apr. 26, 2011, the entire contents of which are incorporated herein by reference, and this application claims the benefit of Japanese Patent Application No. 2010-102405, filed on Apr. 27, 2010 and Japanese Patent Application No. 2011-044014, filed on Mar. 1, 2011 in the Japan Patent Office, the disclosures of which are incorporated herein in its entirety by reference.

BACKGROUND OF THE INVENTION

1. Field of the Invention

The present invention relates to an amorphous silicon film formation method and an amorphous silicon film formation apparatus.

2. Description of the Related Art

Amorphous silicon is used for filling up a contact hole or a line of a semiconductor integrated circuit device. A method of forming an amorphous silicon is disclosed in Patent References 1 and 2, for example. Particularly, the Patent Reference 2 discloses a method for acquiring a conductor layer having planar surfaces by decomposing disilane at a temperature from 400° C. to 500° C.

Recently, along with miniaturization of semiconductor integrated circuit devices, demands for filling up contact holes or lines are becoming more severe.

PRIOR ART REFERENCE (Patent Reference 1)
Japanese Patent Laid-Open Publication No. sho 63-29954
(Patent Reference 2)
Japanese Patent Laid-Open Publication No. hei 1-217956

SUMMARY OF THE INVENTION

However, if miniaturized contact holes or lines are buried with an amorphous silicon formed by using disilane, the formed amorphous silicon exhibits poor coverage at contact holes, and a large void occurs. A large void occurring in a contact hole or a line becomes one of factors for increase in resistance value, for example. Furthermore, the large void is another factor for low precision of surface roughness.

To solve the above and/or other problems, the present invention provides an amorphous silicon film formation method and an amorphous silicon film formation apparatus that may handle progresses of miniaturization of contact holes, lines, or the like by further improving precision of surface roughness.

According to an aspect of the present invention, there is provided an amorphous silicon film formation method comprising:

transferring a base in a process chamber;
heating the base in the process chamber;
setting a process pressure inside the process chamber by evacuating an interior of the process chamber;
forming a seed layer on a surface of the base by flowing aminosilane-based gas in the process chamber under a process condition in which the aminosilane-based gas is not thermally decomposed and adsorbing the aminosilane-based gas onto the surface of the base, the process condition having a first temperature; and forming an amorphous silicon film on the seed layer by heating the base at a second temperature higher than the first temperature, flowing silane-based gas containing no amino group in the process chamber, and thermally decomposing the silane-based gas containing no amino group;

wherein the forming of the seed layer and the forming of the amorphous silicon film are successively performed in the process chamber.

According to another aspect of the present invention, there is provided an amorphous silicon film formation apparatus including a process chamber which houses an object to be processed having a base; a heating device which heats the base housed in the process chamber; an aminosilane-based gas supply unit which supplies an aminosilane-based gas into the process chamber; an silane-based gas supply unit which supplies an silane-based gas containing no amino group into the process chamber; an exhauster which evacuates an interior of the process chamber; and an controller which controls the heating device, the aminosilane-based gas supply unit, the silane-based gas supply unit, and the exhauster to perform a forming of a seed layer and a forming of an amorphous silicon film successively in the process chamber, wherein, in the forming of the seed layer, the seed layer is formed on a surface of the base by flowing the aminosilane-based gas in the process chamber under a process condition in which the aminosilane-based gas is not thermally decomposed and adsorbing the aminosilane-based gas onto the surface of the base, the process condition having a first temperature, and wherein, in the forming of the amorphous silicon film, the amorphous silicon film is formed on the seed layer by heating the base at a second temperature higher than the first temperature, flowing the silane-based gas containing no amino group in the process chamber, and thermally decomposing the silane-based gas containing no amino group.

Additional objects and advantages of the invention will be set forth in the description which follows, and in part will be obvious from the description, or may be learned by practice of the invention.

The objects and advantages of the invention may be realized and obtained by means of the instrumentalities and combinations particularly pointed out hereinafter.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention.

FIG. 3 is a diagram showing a relationship between deposition times and thicknesses of an amorphous silicon film;

FIG. 6 is a enlarged view of the portion B of FIG. 4 indicated by the broken line;

DETAILED DESCRIPTION OF THE INVENTION

Figure 1:
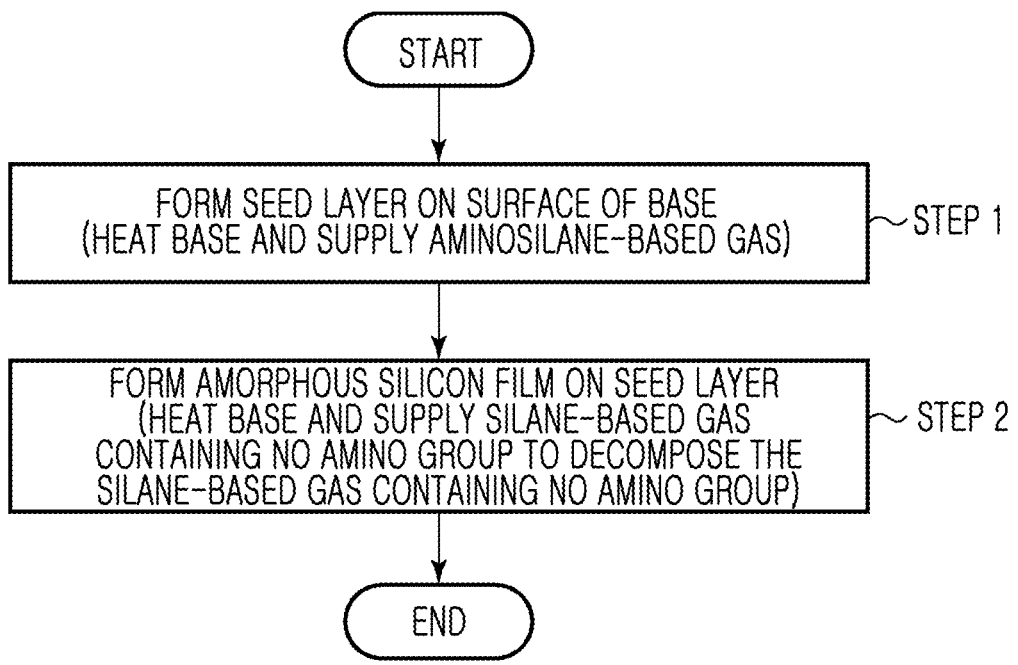
FIG. 1 is a flowchart showing an example of a process sequence of an amorphous silicon film formation method according to an embodiment of the present invention.

An embodiment of the present invention achieved on the basis of the findings given above will now be described with reference to the accompanying drawings. In the following description, the constituent elements having substantially the same function and arrangement are denoted by the same reference numerals, and a repetitive description will be made only when necessary.

Inventors of the present invention have supposed that surface roughness of an amorphous silicon film may be related to incubation time of the amorphous silicon film. In other words, the inventors have supposed that, as incubation time increases, sizes of cores may easily become uneven, and thus precision of the surface roughness of an amorphous silicon film starting being deposited after formation of cores is affected.

However, there has been no known technique for reducing incubation time of an amorphous silicon film.

The inventors of the present invention have succeeded in reducing incubation time of an amorphous silicon film as described below. As a result, the inventors have succeeded in further improving precision of surface roughness of an amorphous silicon film.

Hereinafter, the present invention will be described in detail by explaining exemplary embodiments of the invention with reference to the attached drawings. Like reference numerals in the drawings denote like elements.

Furthermore, throughout the present application, the term 'amorphous silicon' refers not only to amorphous silicon, but also to nanocrystalline silicon, which is a collection of crystal grains sized from amorphous-size to nano-size, sufficient to accomplish precision of surface roughness as disclosed in the present specification, and mixed silicon including the amorphous silicon and the nanocrystalline silicon.

Figure 2A:
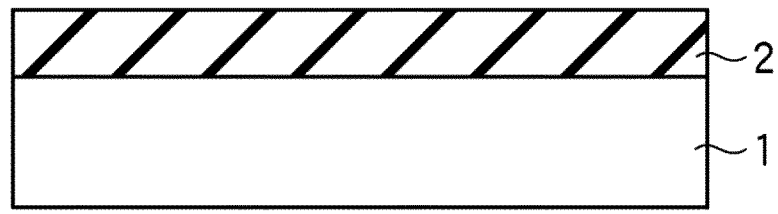
FIG. 2A to FIG. 2C are sectional views schematically showing states of a sample during the process sequence.
Figure 2B:
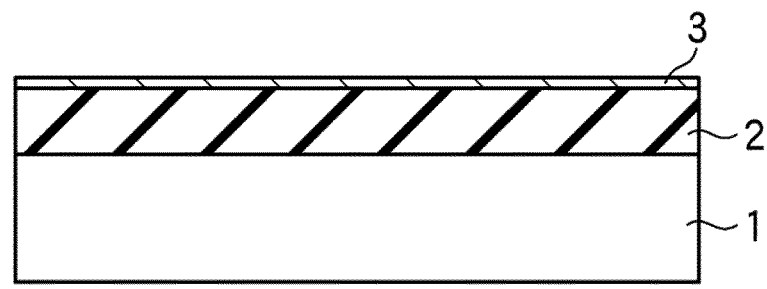
Figure 2C:
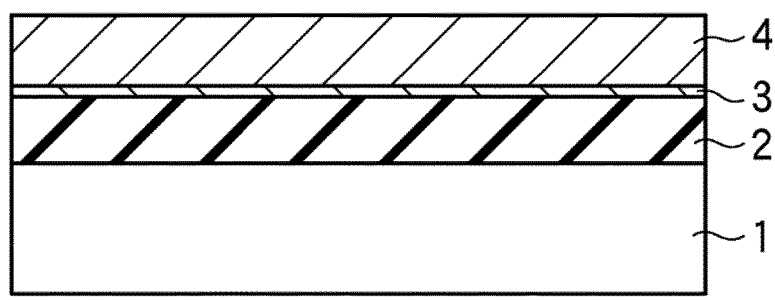

FIG. 1 is a flowchart showing an example of a process sequence of an amorphous silicon film formation method according to an embodiment of the present invention, and FIGS. 2A through 2C are sectional views schematically showing states of a sample during the process sequence.

First, a sample (refer to FIG. 2A) in which a base 2 with about 100 nm thickness is formed on a semiconductor substrate, e.g., a silicon substrate 1, as shown in FIG. 2A is transferred to a process chamber of a film formation apparatus. Examples of the base 2 include a silicon oxide film and a silicon nitride film.

Next, as shown in FIGS. 1 and 2B, a seed layer 3 is formed on a surface of the base 2. In the present embodiment, the seed layer 3 is formed on the surface of the base 2 by heating the base 2 and flowing aminosilane-based gas to the surface of the heated base 2 (step 1).

Examples of the aminosilane-based gas include followings:
  BAS (butylaminosilane),
  BTBAS (bis(tertiary butyl aminosilane))
  DMAS (dimethyl aminosilane),
  BDMAS (bis(dimethyl aminosilane)),
  TDMAS (tris(dimethyl aminosilane)),
  DEAS (diethyl aminosilane)
  BDEAS (bis(diethyl aminosilane))
  DPAS (dipropyl aminosilane),
  DIPAS (diisopropyl aminosilane), and the like. In the present embodiment, the DIPAS is employed.

Examples of process conditions in the step 1 are:
  DIPAS flow: 500 sccm
  process time: 5 min
  process temperature: 400° C.
  process pressure: 53.2 Pa (0.4 Torr). The operations in the step 1 are referred to hereinafter as a preflow.

Next, as shown in FIGS. 1 and 2C, an amorphous silicon film 4 is formed on the seed layer 3.

In the present embodiment, the amorphous silicon film 4 is formed on the seed layer 3 by heating the base 2, supplying silane-based gas containing no amino group to the seed layer 3 on the surface of the heated base 2, and thermally decomposing the silane-based gas containing no amino group (step 2).

An example of the silane-based gas containing no amino group may be a gas containing at least one of:
  $SiH_2$,
  $SiH_4$,
  $SiH_6$,
  $Si_2H_4$,
  $Si_2H_6$,
  a silicon hydride that may be expressed as $Si_mH_{2m+2}$ (here, m is a natural number equal to or greater than 3), and
  a silicon hydride that may be expressed as $Si_nH_{2n}$ (here, n is a natural number equal to or greater than 3). In the present embodiment, $SiH_4$ (monosilane) is employed.

Examples of process conditions in the step 2 are:
  $SiH_4$ flow: 500 sccm
  deposition time: 30 min/45 min/60 min
  process temperature: 500° C.
  process pressure: 53.2 Pa (0.4 Torr).

As described above, according to an amorphous silicon film formation method according to an embodiment of the present invention, after preflow of aminosilane-based gas onto the surface of the base 2, the amorphous silicon film 4 is formed on the seed layer 3.

Figure 4:
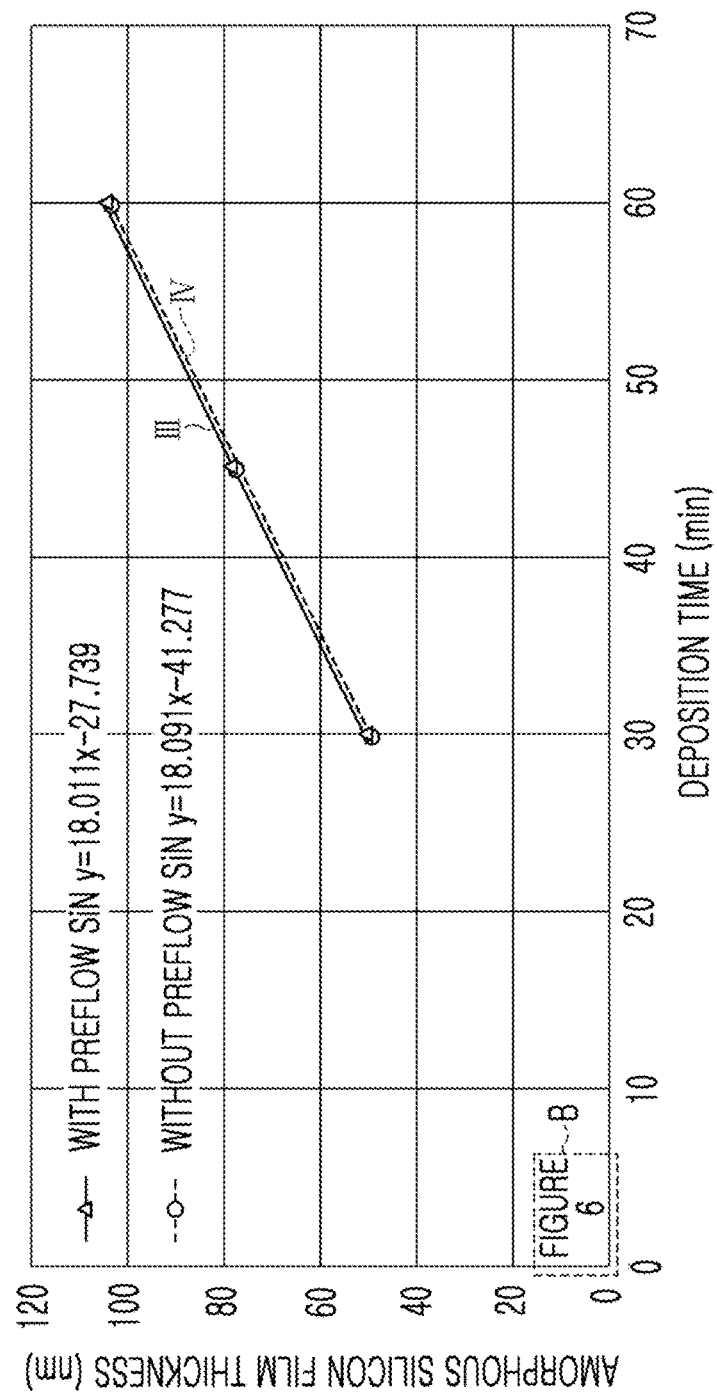
FIG. 4 is a diagram showing a relationship between deposition times and thicknesses of the amorphous silicon film.

FIGS. 3 and 4 show a relationship between deposition times and thicknesses of the amorphous silicon film 4. FIG. 3 shows a case where a silicon oxide ($SiO_2$) film is used as the base 2, and FIG. 4 shows a case where a silicon nitride (SiN) film is used as the base 2. The thicknesses of the amorphous silicon film 4 were measured in three cases: the case where the deposition time is 30 minutes, the case where the deposition time is 45 minutes, and the case where the deposition time is 60 minutes.

In FIGS. 3 and 4, lines I and III indicate the case with preflow, whereas lines II and IV indicates the case without preflow. The lines I through IV are straight lines indicating the three measured film thicknesses that are linearly approximated by using the least squares method, and equations thereof are as follows:

| Line I:   | y = 17.572x − 20.855 | (1) |
| Line II:  | y = 17.605x − 34.929 | (2) |
| Line III: | y = 18.011x − 27.739 | (3) |
| Line IV:  | y = 18.091x − 41.277 | (4) |

As shown in FIGS. 3 and 4, it is clear that, compared to the case without preflow, the thickness of the amorphous silicon film 4 tends to increase in the case with preflow.

Figure 5:
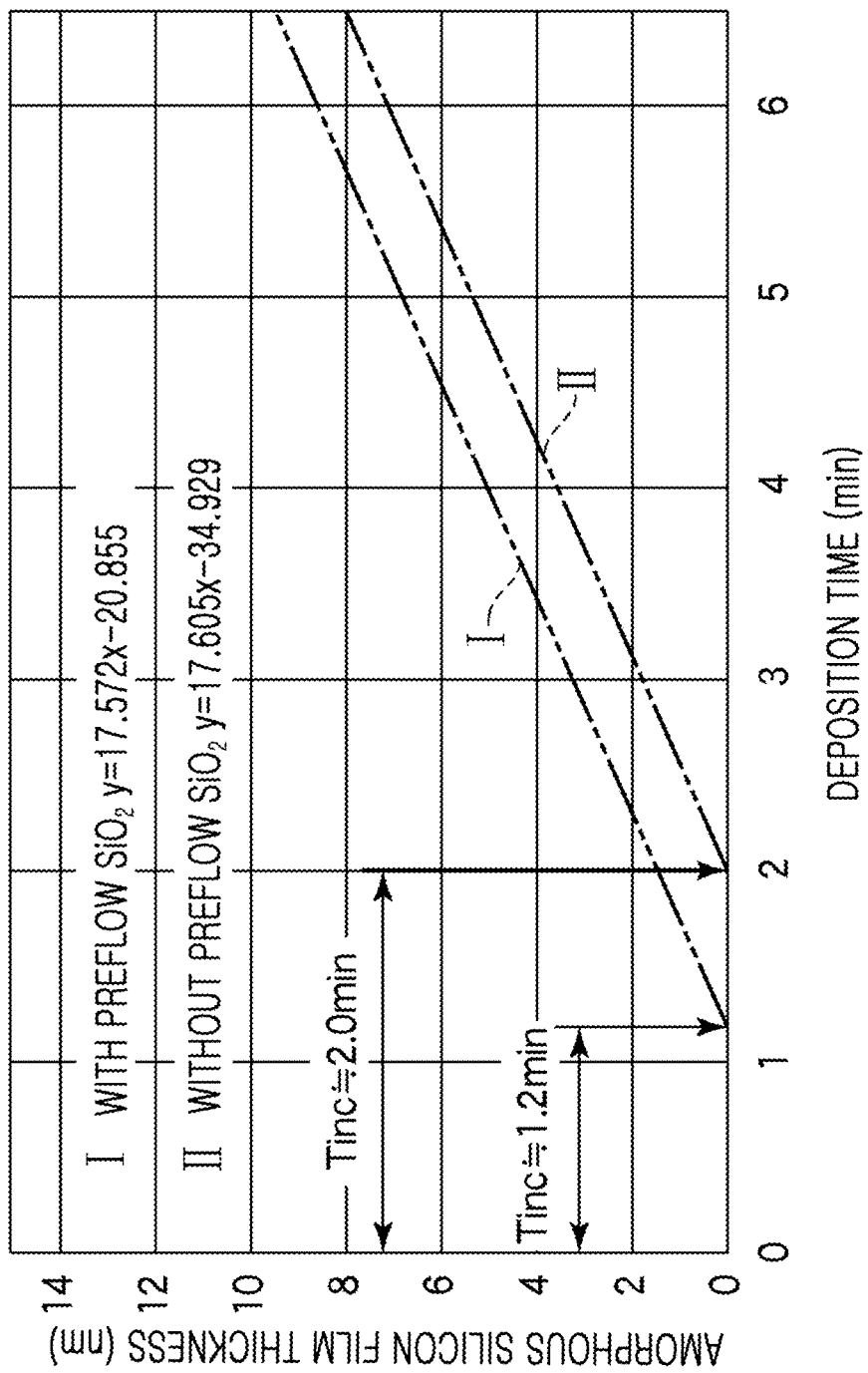
FIG. 5 is a enlarged view of the portion A of FIG. 3 indicated by the broken line.

FIGS. 5 and 6 show intersection points between the lines I through IV and deposition times in the case where a condition y=0 is given to the equations (1) through (4), that is, if the thicknesses of an amorphous silicon film is "0." Furthermore, FIG. 5 is a enlarged view of the portion A of FIG. 3 indicated by the broken line, and FIG. 6 is a enlarged view of the portion B of FIG. 4 indicated by the broken line.

As shown in FIG. 5, if the base 2 is a silicon oxide film with preflow, deposition of the amorphous silicon film 4 begins about 1.2 min (x≈1.189) after initiation of a process. On the contrary, if the base 2 is a silicon oxide film without preflow, deposition of the amorphous silicon film 4 begins about 2.0 min (x≈1.984) after initiation of a process.

Furthermore, as shown in FIG. 6, if the base 2 is a silicon nitride film with preflow, deposition of the amorphous silicon film 4 begins about 1.5 min (x≈1.540) after initiation of a process. On the contrary, if the base 2 is a silicon nitride film without preflow, deposition of the amorphous silicon film 4 begins about 2.3 min (x≈2.282) after initiation of a process.

As described above, by performing preflow of aminosilane-based gas with respect to the base 2, incubation time could be reduced from about 2.0 minutes to about 1.2 minutes in the case where the base 2 was a silicon oxide film, and incubation time could be reduced from about 2.3 minutes to about 1.5 minutes in the case where the base 2 was a silicon nitride film.

Figure 7A:
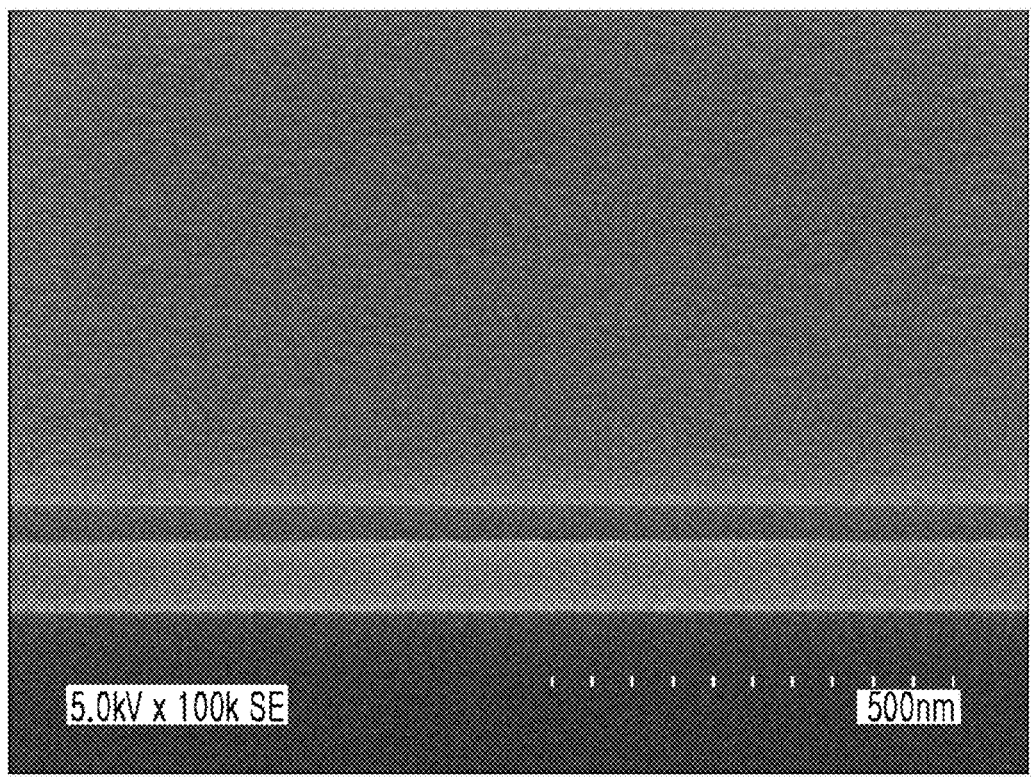
FIG. 7A is a photograph used in lieu of a drawing showing secondary electron images of a surface and a cross-section of amorphous silicon films.
Figure 7B:
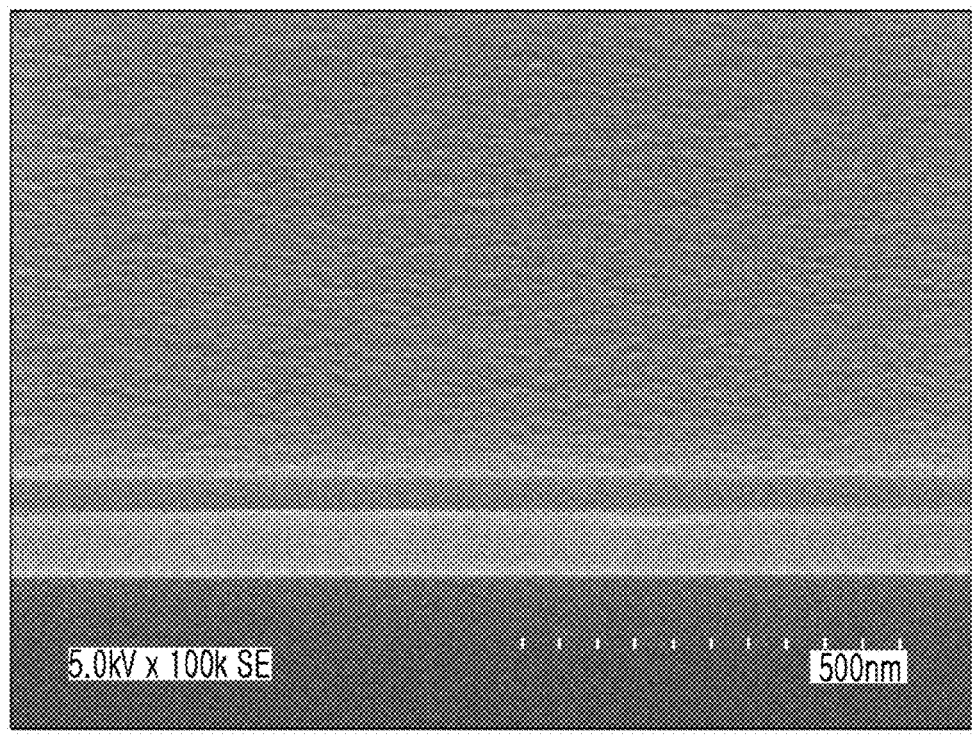
FIG. 7B is a photograph used in lieu of a drawing showing secondary electron images of a surface and a cross-section of amorphous silicon films.
Figure 8A:
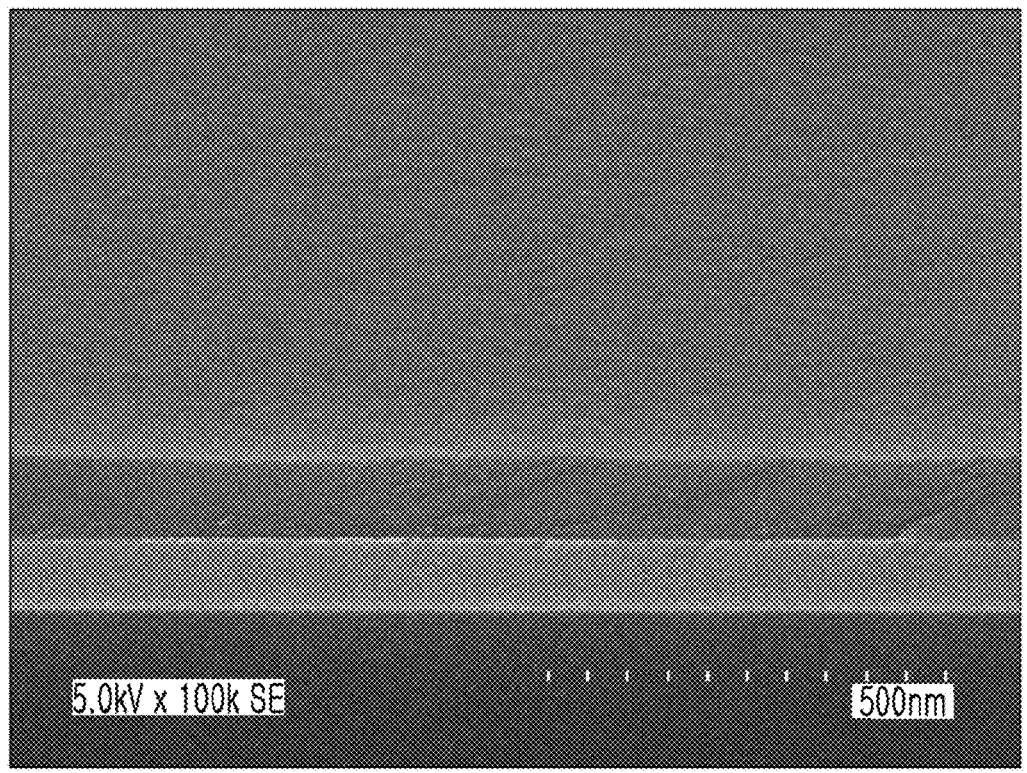
FIG. 8A is a photograph used in lieu of a drawing showing secondary electron images of a surface and a cross-section of amorphous silicon films.
Figure 8B:
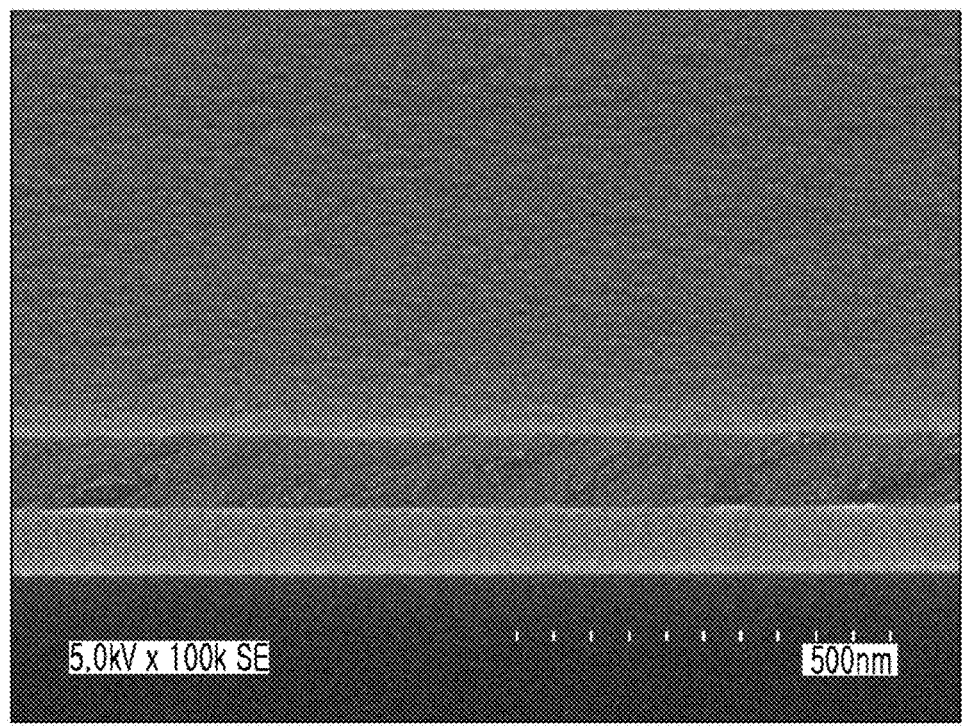
FIG. 8B is a photograph used in lieu of a drawing showing secondary electron images of a surface and a cross-section of amorphous silicon films.

FIGS. 7A through 8B show results of observations of surfaces of amorphous silicon films made by using a scanning electron microscope (SEM). FIGS. 7A and 7B show secondary electron images of a surface and a cross-section of an amorphous silicon film having 50 nm thickness, and FIGS. 8A and 8B show secondary electron images of a surface and a cross-section of an amorphous silicon film having 100 nm thickness. Acceleration voltage of the SEM is 5.0 kV, and magnification is 100,000× (×100k). Furthermore, the bases are silicon oxide films.

As shown in FIG. 7A, compared to the case without preflow (FIG. 7B), it is clearly seen that the surface of the amorphous silicon film is relatively smooth in the case with preflow of aminosilane-based gas, thus exhibiting enhanced surface roughness.

Furthermore, as shown in FIG. 8A, the same effect may be observed from the amorphous silicon film having 100 nm thickness, and, compared to the case without preflow (FIG. 8B), surface roughness of the amorphous silicon film is enhanced.

As described above, according to an amorphous silicon film formation method according to an embodiment of the present invention, enhanced surface roughness is observed with the naked eye from a surface image obtained through the SEM.

Figure 9:
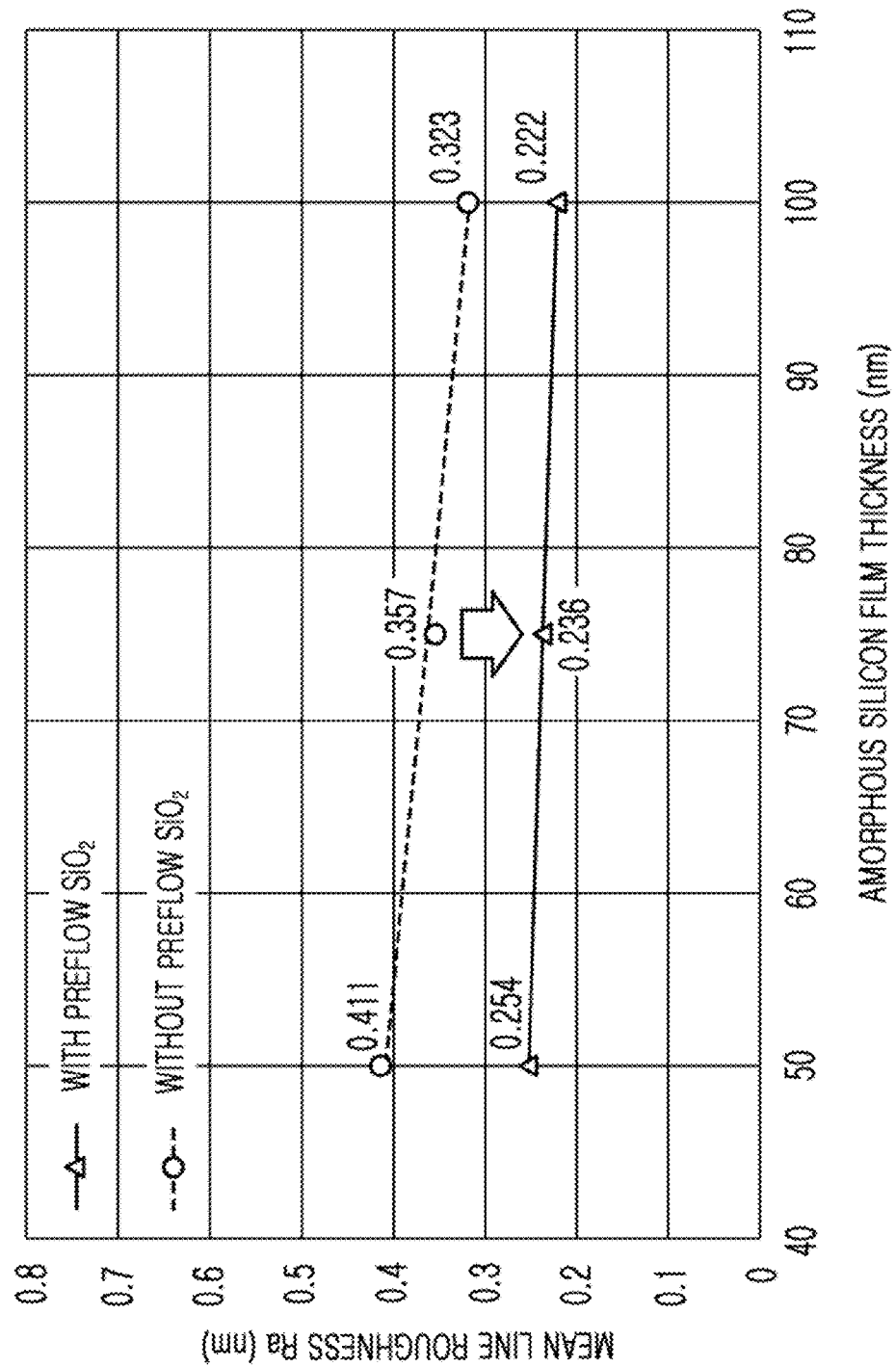
FIG. 9 is a diagram showing a relationship between a thickness of an amorphous silicon film and a mean line roughness Ra of a surface of an amorphous silicon film.

FIG. 9 shows a mean line roughness (surface roughness) Ra of a surface of an amorphous silicon film measured by using an atomic force microscope (AFM). In the result shown in FIG. 9, a scanning size of the AFM is set to 1 μm, and a scanning rate of the AFM is set to 1.993 Hz.

As shown in FIG. 9, it is observed that, compared to the case without preflow, a mean line roughness (surface roughness) Ra is enhanced by from 0.101 nm to 0.157 nm within a range between 50 nm film thickness to 100 nm film thickness in the case with preflow of aminosilane-based gas. Based on the result measured by using the AFM, it has proved that, compared to the case without preflow, an amorphous silicon film formation method according to an embodiment of the present invention is highly effective for enhancing a mean line roughness (surface roughness) Ra, particularly in the case of an amorphous silicon film having a small thickness. For example, in the case of an amorphous silicon film having about 50 nm thickness, Ra was 0.411 in the case without preflow. On the contrary, in the case with preflow, Ra was 0.254, where Ra was improved by 0.157 nm. The result shows that an amorphous silicon film formation method according to an embodiment of the present invention is more effective as miniaturization of semiconductor devices proceeds, for example.

Figure 10:
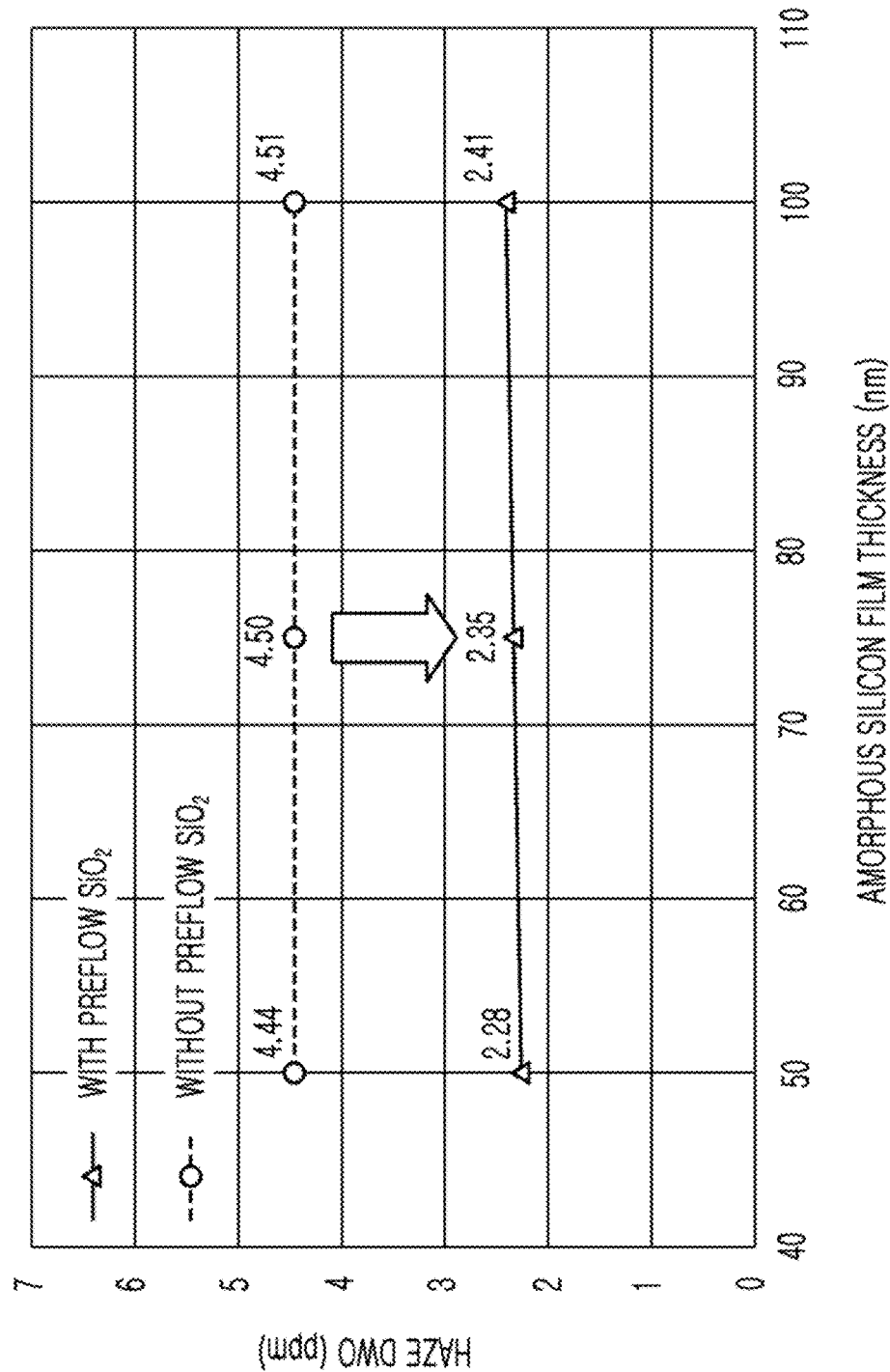
FIG. 10 is a diagram showing a relationship between a thickness of an amorphous silicon film and a haze of a surface of an amorphous silicon film.

FIG. 10 shows haze of a surface of an amorphous silicon film, measured by using a surface testing device. The haze shown in FIG. 10 is a haze in DWO (Dark Field Wide Oblique) mode.

As shown in FIG. 10, it is observed that, compared to the case without preflow, haze is enhanced by about 2.1 ppm within a range between 50 nm film thickness to 100 nm film thickness in the case with preflow of aminosilane-based gas.

Based on observations provided using the SEM and the AFM, and the results of the measurements obtained using the surface testing device, in an amorphous silicon film formation method according to an embodiment of the present invention, the amorphous silicon film 4 with highly precise surface roughness, that is, with small surface roughness may be formed by performing preflow of aminosilane-based gas on the surface of the base 2, forming the seed layer 3 on the surface of the base 2, supplying silane-based gas containing no amino group onto the seed layer 3, and thermally decomposing the silane-based gas containing no amino group.

Figure 11:
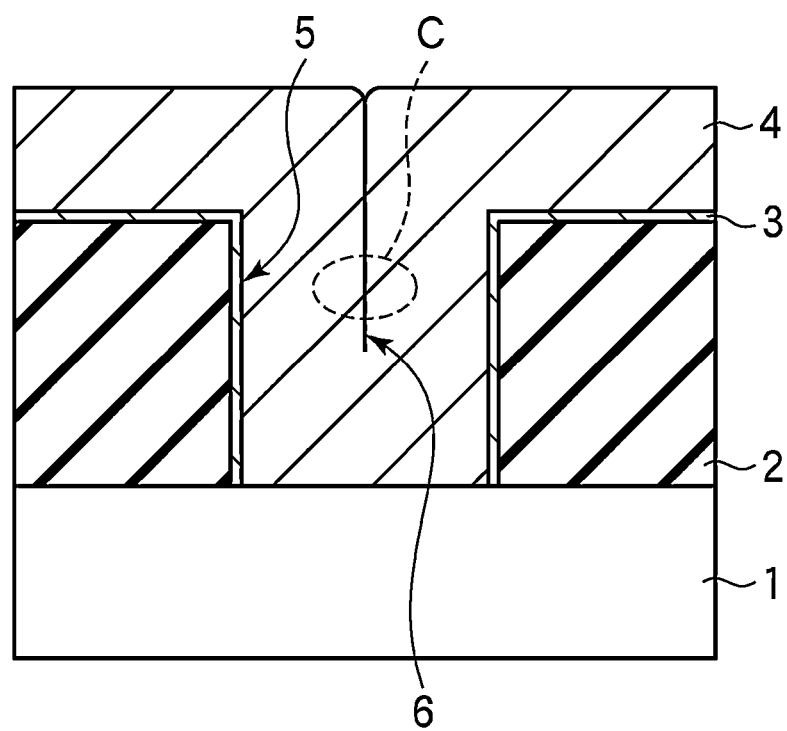
FIG. 11 is a sectional view showing an example structure of a contact hole formed in an interlayer insulation film.
Figure 12A:
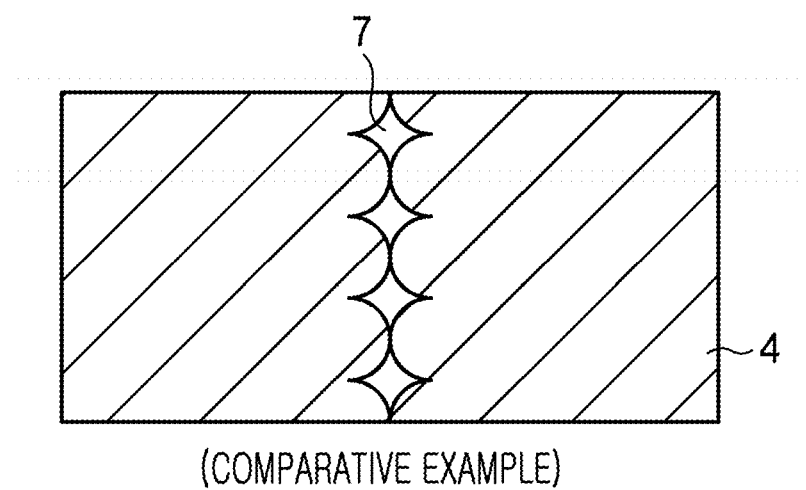
FIG. 12A is a enlarged view of the circle C of FIG. 11 indicated by the broken line in a comparative example.
Figure 12B:
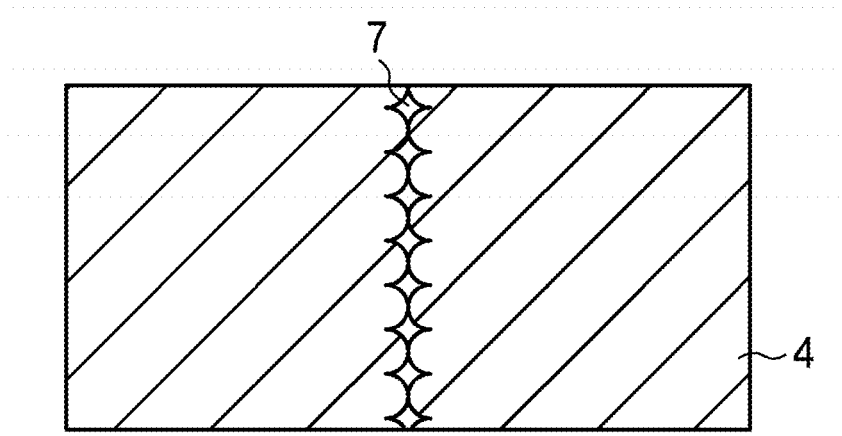
FIG. 12B is a enlarged view of the circle C of FIG. 11 indicated by the broken line in an embodiment of the present invention.

As shown in FIG. 11, such an amorphous silicon film is useful for filling up a contact hole 5 formed in an interlayer insulation film including the base 2, for example, a silicon oxide film or a silicon nitride film, or for filling up a line formed in the interlayer insulation film, e.g., a groove for internal wiring. FIGS. 12A and 12B are enlarged view of a contact portion 6 at which portions of a surface of the amorphous silicon film 4 contact each other within the contact hole 5. FIGS. 12A and 12B correspond to enlarged view of the interior of the circle C of the FIG. 11 indicated by the broken line.

In the case where the amorphous silicon film 4 has a large surface roughness, a large void 7 is formed at the contact portion 6 as shown in FIG. 12A. On the contrary, in the case of the amorphous silicon film 4 that is formed by using a film formation method according to an embodiment of the present invention and has a small surface roughness, the void 7 formed at the contact portion 6 is small, as shown in FIG. 12B.

If the void 7 becomes small, increase of the resistance value of the amorphous silicon film 4 buried in the contact hole 5 may be suppressed.

Furthermore, according to a conventional successive film formation method, which is considered as a method for forming a film with fine surface roughness and uses a seed layer formed by using disilane gas and amorphous silicon formed by using silane gas, there is difficulty in applying the conventional successive film formation method to fine contact holes since deterioration of coverage (formation of void) occurs at upper corners of a contact hole due to increase in film formation.

On the contrary, according to an embodiment of the present invention, not only coverage of a film formation may increase, but also surface roughness may be further improved as compared to the successive film formation method stated above.

Therefore, according to an embodiment of the present invention, an amorphous silicon film formation method that may handle progresses of miniaturization of contact holes, lines, or the like in a semiconductor device may be provided by further improving precision of surface roughness of the amorphous silicon film 4. Furthermore, the amorphous silicon film 4 formed by using the film formation method according to an embodiment of the present invention is useful for filling up the contact hole 5 or a line formed in an interlayer insulation layer.

Next, an example of film formation apparatuses for implementing the amorphous silicon film formation method according to the above embodiment will be described.

Figure 13:
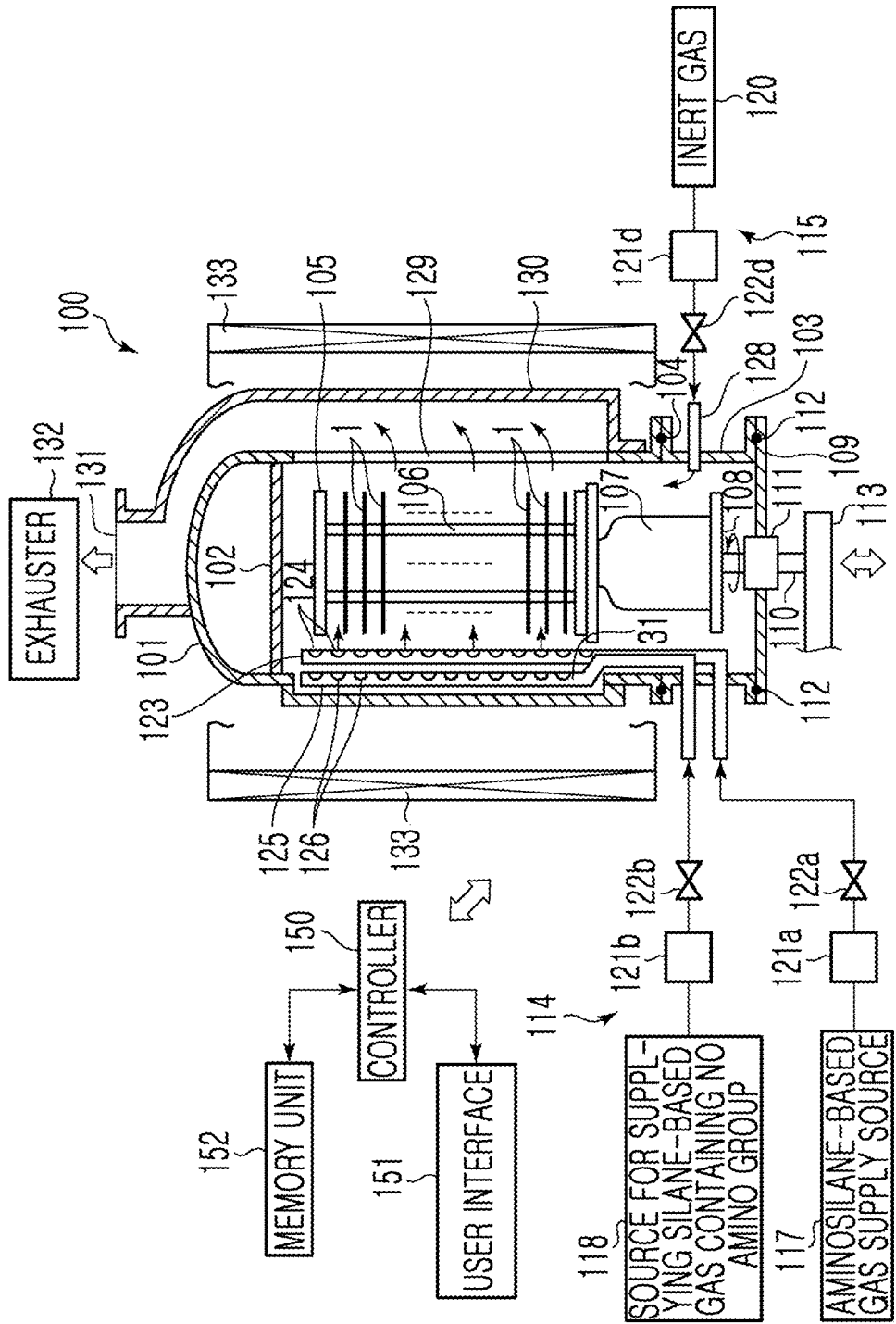
FIG. 13 is a sectional view schematically showing an example of a film formation apparatus capable of implementing an amorphous silicon film formation method according to an embodiment of the present invention.

FIG. 13 is a sectional view schematically showing an example of a film formation apparatus for implementing an amorphous silicon film formation method according to an embodiment of the present invention.

As shown in FIG. 13, a film formation apparatus 100 includes a process chamber 101 having a shape of a bottom-open cylinder with a ceiling. The entire process chamber 101 is formed of quartz, for example. A quartz ceiling plate 102 is provided on the ceiling of the process chamber 101. A manifold 103, which is molded of a stainless steel, for example, and has a cylindrical shape, is connected to a bottom opening of the process chamber 101 via a sealing member 104, such as an O-ring.

The manifold 103 supports the bottom of the process chamber 101. A quartz wafer boat 105, on which a plurality of, for example, 50 to 100, semiconductor substrates (the silicon substrates 1 in the present embodiment) as objects to be processed can be held in multiple layers, may be inserted from below the manifold 103 into the process chamber 101. Accordingly, an object to be processed, e.g., a semiconductor substrate (the silicon substrate 1 on which a SiO$_2$ film is deposited as a base in advance in the present embodiment), is housed in the process chamber 101. The wafer boat 105 has a plurality of pillars 106, so that a plurality of the silicon substrates 1 are supported by grooves formed on the pillars 106.

The wafer boat 105 is disposed on a table 108 via a quartz thermos vessel 107. The table 108 is supported by a rotation shaft 110, which penetrates, for example, a stainless steel cover unit 109 for opening and closing the bottom opening of the manifold 103. A magnetic fluid seal 111, for example, is provided on a portion of the rotation shaft 110 penetrating the cover unit 109 so as to tightly seal the rotation shaft 110 and to rotatably support the rotation shaft 110. A sealing member 112, e.g., an O-ring, is installed between the peripheral portion of the cover unit 109 and the bottom of the manifold 103. Accordingly, sealing of the process chamber 101 is held. The rotation shaft 110 is attached to the leading end of an arm 113 supported by an elevating mechanism (not shown), such as a boat elevator, or the like. Therefore, the wafer boat 105, the cover unit 109, and the like are elevated together and are inserted to and pulled out from the process chamber 101.

The film formation apparatus 100 includes a process gas supply mechanism 114, which supplies a gas for using in process into the process chamber 101.

The process gas supply mechanism 114 includes an aminosilane-based gas supply source 117 and a source 118 for supplying silane-based gas containing no amino group.

The aminosilane-based gas supply source 117 is connected to a distribution nozzle 123 via a flow controller 121a and an opening/closing valve 122a. The distribution nozzle 123 is a quartz pipe and penetrates a sidewall of the manifold 103 inwardly, is bent upward and vertically extends. A plurality of gas ejecting holes 124 are formed apart from each other at intervals of a predetermined distance in the vertically extending portion of the distribution nozzle 123. The aminosilane-based gas is ejected from each of the gas ejecting holes 124 almost uniformly in a horizontal direction toward the interior of the process chamber 101.

The source 118 for supplying silane-based gas containing no amino group is connected to a distribution nozzle 125 via a flow controller 121b and an opening/closing valve 122b. The distribution nozzle 125 is a quartz pipe and penetrates a sidewall of the manifold 103 inwardly, is bent upward and vertically extends. A plurality of gas ejecting holes 126 are formed apart from each other at intervals of a predetermined distance in the vertically extending portion of the distribution nozzle 125. The silane-based gas containing no amino group is ejected from each of the gas ejecting holes 126 almost uniformly in a horizontal direction toward the interior of the process chamber 101.

An exhaust port 129 for evacuating the interior of the process chamber 101 is provided on a portion of the process chamber 101, the portion opposite to the distribution nozzles 123 and 125. The exhaust port 129 is provided to be long and narrow by vertically cutting the sidewall of the process chamber 101. An exhaust port cover member 130 having a U-shaped cross-section to cover the exhaust port 129 is weld-attached to a portion of the process chamber 101 corresponding to the exhaust port 129. The exhaust port covering member 130 extends upward along the sidewall of the process chamber 101, so that a gas outlet 131 is defined on the top of the process chamber 101. An exhauster 132 including a vacuum pump or the like is connected to the gas outlet 131. The exhauster 132 evacuates the interior of the process chamber 101 to evacuate process gas used for a film formation process and to set the pressure inside the process chamber 101 to a process pressure according to a process.

A barrel-shaped heating device 133 is disposed to surround the outer perimeter of the process chamber 101. The heating device 133 activates gas supplied into the process chamber 101 and heats objects to be processed housed in the process chamber 101, e.g., semiconductor substrates (the silicon substrates 1 in the present embodiment).

A controller 150, which includes, for example, a microprocessor (computer), controls each component of the film formation apparatus 100. A user interface 151, such as a keyboard by which an operator performs command input and the like to manage the film formation apparatus 100, a display to visually display an operational status of the film formation apparatus 100, or the like, is connected to the controller 150.

A memory unit 152 is connected to the controller 150. The memory unit 152 contains a control program for accomplishing various processes executed in the film formation apparatus 100 under the control of the controller 150, or a program, that is, a recipe, for instructing each component of the film formation apparatus 100 to execute a process according to process conditions. The recipe is stored in a storage medium in the memory unit 152, for example. The storage medium may be a hard disk or a semiconductor memory, or may be a portable type medium such as a CD-ROM, a DVD, a flash memory, or the like. Alternatively, the recipe may be suitably transmitted from another device, for example, via a dedicated line. If required, processes desired by the film formation apparatus 100 are performed under the control of the controller 150 by invoking a recipe from the memory unit 152 according to instructions or the like from the user interface 151 and performing a process based on the recipe in the controller 150.

In the present embodiment, processes of the film formation method according to the above embodiment are sequentially performed under the control of the controller 150.

The film formation method according to the above embodiment may be performed by the film formation apparatus 100 as shown in FIG. 13. However, a film formation apparatus according to the present invention is not limited to a batch type film formation apparatus as shown in FIG. 13, and a single wafer type film formation apparatus may also be utilized.

While this invention has been particularly shown and described with reference to exemplary embodiments thereof, the present invention is not limited to the above embodiments, and various changes may be made therein.

For example, although detailed examples of the process conditions are provided in the above embodiment of the present invention, process conditions are not limited to the process conditions provided above.

The advantage of the present invention, that is, enhancement of surface roughness of an amorphous silicon film, is acquired by including a process forming the amorphous silicon film 4 by performing preflow of aminosilane-based gas on the surface of the base 2, forming the seed layer 3 on the surface of the base 2, supplying silane-based gas containing no amino group onto the seed layer 3, and thermally decomposing the silane-based gas containing no amino group.

Therefore, process conditions are not limited to the detailed examples described above with respect to the above embodiment, and may be modified according to changes in a size of the silicon substrate 1, a capacity of the process chamber, or the like without deteriorating the advantage.

Furthermore, the film formation method according to the above embodiment enables enhancement of surface roughness, e.g., a mean line roughness Ra, on the order of 0.1 nm, and thus the film formation method according to the above embodiment is suitable for processes for manufacturing semiconductor devices.

Furthermore, if the thickness of the seed layer 3 increases, the thickness of the amorphous silicon film 4 increases, and thus miniaturization of a semiconductor device is deteriorated. Furthermore, the seed layer 3 is a layer for uniform generation of amorphous silicon cores. Therefore, the thickness of the seed layer 3 may be small, and more preferably, may be a single atomic layer level thickness. In detail, the thickness of the seed layer 3 may be from 0.1 nm to 0.3 nm.

Furthermore, the aminosilane-based gas may be a monovalent aminosilane-based gas, e.g., DIPAS.

Furthermore, aminosilane may be adsorbed onto the base 2, for example, instead of being decomposed. For example, DIPAS is thermally decomposed at a temperature equal to or above 450° C. When aminosilane is thermally decomposed, impurities including carbon (C), nitrogen (N), or the like may be mixed into a formed film. An advantage of adsorbing aminosilane onto the base 2, for example, instead of thermally decomposing the aminosilane, is that a formed film may be prevented from being mixed with impurities.

Furthermore, as described in the description of the above embodiment, the thickness of the amorphous silicon film 4 may be from 50 nm to 100 nm. However, the thickness of the amorphous silicon film 4 may also be in ranges of equal to or below 50 nm or equal to or above 100 nm, for example.

Furthermore, in the above embodiment, a silicon hydride that may be expressed as $Si_mH_{2m+2}$ (here, m is a natural number equal to or greater than 3) and a silicon hydride that may be expressed as $Si_nH_{2n}$ (here, n is a natural number equal to or greater than 3), which are so-called higher order silanes, are illustrated as examples of the silane-based gas containing no amino group.

For example, as the higher order silanes, a silicon hydride expressed as $Si_mH_{2m+2}$ (here, m is a natural number equal to or greater than 3) may be at least one of:
  trisilane ($Si_3H_8$),
  tetrasilane ($Si_4H_{10}$),
  pentasilane ($Si_5H_{12}$),
  hexasilane ($Si_6H_{14}$), and
  heptasilane ($Si_7H_{16}$).

Furthermore, for example, a silicon hydride expressed as $Si_nH_{2n}$ (here, n is a natural number equal to or greater than 3) may be at least one of:
  cyclotrisilane ($Si_3H_6$),
  cyclotetrasilane ($Si_4H_8$),
  cyclopentasilane ($Si_6H_{10}$),
  cyclohexasilane ($Si_6H_{12}$), and
  cycloheptasilane ($Si_7H_{14}$).

Furthermore, in the case of considering a combination of an aminosilane-based gas and a silane-based gas (silicon source) containing no amino group, monosilane ($SiH_4$) or disilane ($SiH_6$), which may easily be thermally decomposed at a temperature closed to a temperature at which an aminosilane-based gas is thermally decomposed, may be employed.

An amorphous silicon film formation method and apparatus according to the present invention may handle progresses of miniaturization of contact holes, lines, or the like by improving precision of surface roughness.

Various other changes in form and details may be made in the present invention without departing from the spirit and scope of the invention as defined by the appended claims.

What is claimed is:

1. An amorphous silicon film formation method comprising:
  transferring a base in a process chamber;
  heating the base in the process chamber;
  setting a process pressure inside the process chamber by evacuating an interior of the process chamber;
  forming a seed layer on a surface of the base by flowing aminosilane-based gas in the process chamber under a process condition in which the aminosilane-based gas is not thermally decomposed and adsorbing the aminosilane-based gas onto the surface of the base, the process condition having a first temperature; and
  forming an amorphous silicon film on the seed layer by heating the base at a second temperature higher than the first temperature, flowing silane-based gas containing no amino group in the process chamber, and thermally decomposing the silane-based gas containing no amino group;
  wherein the forming of the seed layer and the forming of the amorphous silicon film are successively performed in the process chamber.

2. The amorphous silicon film formation method of claim 1, wherein the second temperature is lower than 450° C. at which the aminosilane-based gas is not thermally decomposed.

3. The amorphous silicon film formation method of claim 2, wherein the second temperature is 400° C.

4. The amorphous silicon film formation method of claim 1, wherein the second temperature is 500° C.

5. The amorphous silicon film formation method of claim 1, wherein the aminosilane-based gas is selected from among gases containing at least one of:
BAS (butylaminosilane);
BTBAS (bis(tertiary butyl aminosilane));
DMAS (dimethyl aminosilane);
BDMAS (bis(dimethyl aminosilane));
TDMAS (tris(dimethyl aminosilane));
DEAS (diethyl aminosilane);
BDEAS (bis(diethyl aminosilane));
DPAS (dipropyl aminosilane); and
DIPAS (diisopropyl aminosilane), and
the silane-based gas containing no amino group is selected from among gases containing at least one of:
$SiH_4$;
$Si_2H_6$;
trisilane ($Si_3H_8$);
tetrasilane ($Si_4H_{10}$);
pentasilane ($Si_5H_{12}$);
hexasilane ($Si_6H_{14}$);
heptasilane ($Si_7H_{16}$);
cyclotrisilane ($Si_3H_6$);
cyclotetrasilane ($Si_4H_8$);
cyclopentasilane ($Si_5H_{10}$);
cyclohexasilane ($Si_6H_{12}$); and
cycloheptasilane ($Si_7H_{14}$).

6. The amorphous silicon film formation method of claim 5, wherein the aminosilane-based gas is DIPAS (diisopropyl aminosilane) and the silane-based gas containing no amino group is any one of $SiH_4$ and $Si_2H_6$.

7. The amorphous silicon film formation method of claim 1, wherein a thickness of the seed layer is a single atomic layer level.

8. The amorphous silicon film formation method of claim 7, wherein the thickness of the seed layer is from 0.1 nm to 0.3 nm.

9. The amorphous silicon film formation method of claim 1, wherein a silicon oxide film or a silicon nitride film is formed on the surface of the base.

10. An amorphous silicon film formation apparatus comprising:
a process chamber which houses an object to be processed having a base;
a heating device which heats the base housed in the process chamber;
an aminosilane-based gas supply unit which supplies an aminosilane-based gas into the process chamber;
an silane-based gas supply unit which supplies an silane-based gas containing no amino group into the process chamber;
an exhauster which evacuates an interior of the process chamber; and
an controller which controls the heating device, the aminosilane-based gas supply unit, the silane-based gas supply unit, and the exhauster to perform a forming of a seed layer and a forming of an amorphous silicon film successively in the process chamber,
wherein, in the forming of the seed layer, the seed layer is formed on a surface of the base by flowing the aminosilane-based gas in the process chamber under a process condition in which the aminosilane-based gas is not thermally decomposed and adsorbing the aminosilane-based gas onto the surface of the base, the process condition having a first temperature, and
wherein, in the forming of the amorphous silicon film, the amorphous silicon film is formed on the seed layer by heating the base at a second temperature higher than the first temperature, flowing the silane-based gas containing no amino group in the process chamber, and thermally decomposing the silane-based gas containing no amino group.

11. The amorphous silicon film formation apparatus of claim 10, wherein the second temperature is lower than 450° C. at which the aminosilane-based gas is not thermally decomposed.

12. The amorphous silicon film formation apparatus of claim 11, wherein the second temperature is 400° C.

13. The amorphous silicon film formation apparatus of claim 10, wherein the second temperature is 500° C.

14. The amorphous silicon film formation apparatus of claim 10, wherein the aminosilane-based gas is selected from among gases containing at least one of:
BAS (butylaminosilane);
BTBAS (bis(tertiary butyl aminosilane));
DMAS (dimethyl aminosilane);
BDMAS (bis(dimethyl aminosilane));
TDMAS (tris(dimethyl aminosilane));
DEAS (diethyl aminosilane);
BDEAS (bis(diethyl aminosilane));
DPAS (dipropyl aminosilane); and
DIPAS (diisopropyl aminosilane), and
the silane-based gas containing no amino group is selected from among gases containing at least one of:
$SiH_4$;
$Si_2H_6$;
trisilane ($Si_3H_8$);
tetrasilane ($Si_4H_{10}$);
pentasilane ($Si_5H_{12}$);
hexasilane ($Si_6H_{14}$);
heptasilane ($Si_7H_{16}$);
cyclotrisilane ($Si_3H_6$);
cyclotetrasilane ($Si_4H_8$);
cyclopentasilane ($Si_5H_{10}$);
cyclohexasilane ($Si_6H_{12}$); and
cycloheptasilane ($Si_7H_{14}$).

15. The amorphous silicon film formation apparatus of claim 14, wherein the aminosilane-based gas is DIPAS (diisopropyl aminosilane) and the silane-based gas containing no amino group is any one of $SiH_4$ and $Si_2H_6$.

16. The amorphous silicon film formation apparatus of claim 10, wherein a thickness of the seed layer is a single atomic layer level.

17. The amorphous silicon film formation apparatus of claim 16, wherein the thickness of the seed layer is from 0.1 nm to 0.3 nm.

18. The amorphous silicon film formation apparatus of claim 10, wherein a silicon oxide film or a silicon nitride film is formed on the surface of the base.

* * * * *